(12) United States Patent
Shi (10) Patent No.: US 11,408,064 B2
(45) Date of Patent: Aug. 9, 2022

(54) MASK STRUCTURE AND FCVA APPARATUS

(71) Applicant: BEIJING NAURA MICROELECTRONICS EQUIPMENT CO., LTD., Beijing (CN)

(72) Inventor: Quanyu Shi, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/608,617

(22) PCT Filed: Jun. 30, 2020

(86) PCT No.: PCT/CN2020/099265
§ 371 (c)(1),
(2) Date: Nov. 3, 2021

(87) PCT Pub. No.: WO2021/004331
PCT Pub. Date: Jan. 14, 2021

(65) Prior Publication Data
US 2022/0145440 A1    May 12, 2022

(30) Foreign Application Priority Data
Jul. 5, 2019 (CN) .......................... 201910605875.7

(51) Int. Cl.
*C23C 14/04* (2006.01)
*C23C 14/32* (2006.01)
*H01J 37/32* (2006.01)

(52) U.S. Cl.
CPC .......... *C23C 14/042* (2013.01); *C23C 14/325* (2013.01); *H01J 37/32055* (2013.01); *H01J 37/32651* (2013.01); *H01J 37/32715* (2013.01)

(58) Field of Classification Search
CPC .......... H01J 37/32055; H01J 37/32651; H01J 37/32633; H01J 37/32642; H01J 37/32715; C23C 14/042; C23C 14/325
(Continued)

(56) References Cited

FOREIGN PATENT DOCUMENTS

| CN | 102080206 A | 6/2011 |
|---|---|---|
| CN | 102131949 A | 7/2011 |

(Continued)

OTHER PUBLICATIONS

The World Intellectual Property Organization (WIPO) International Search Report for PCT/CN2020/099265 dated Sep. 30, 2020 5 Pages.

*Primary Examiner* — Rodney G McDonald
(74) *Attorney, Agent, or Firm* — Anova Law Group PLLC (57) ABSTRACT

Embodiments of the present disclosure provide a mask structure and a filtered cathodic vacuum arc (FCVA) apparatus. The mask structure is configured to prepare protrusions on a carrying surface of an electrostatic chuck and includes a main mask plate and a side mask plate that are made of a conductive metal. The main mask plate is configured to form a patterned film layer corresponding to the protrusions on the carrying surface of the electrostatic chuck. The side mask is configured to cover a side surface of the electrostatic chuck to avoid forming a film layer on the side surface. The mask structure can be electrically conductive. The mask structure may prevent the side surface of the electrostatic chuck from being coated when the protrusions are prepared on the carrying surface of the electrostatic chuck. Thus, the mask structure may be applied to an FCVA process.

20 Claims, 6 Drawing Sheets

(58) Field of Classification Search
USPC .................................... 204/192.38, 298.41
See application file for complete search history.

(56) References Cited

FOREIGN PATENT DOCUMENTS

| | | |
|---|---|---|
| CN | 202231261 U | 5/2012 |
| CN | 105200370 A | 12/2015 |
| CN | 105514692 A | 4/2016 |
| CN | 106935541 A | 7/2017 |
| CN | 107735510 A | 2/2018 |
| CN | 108538776 A | 9/2018 |
| CN | 110158029 A | 8/2019 |
| JP | H1046339 A | 2/1998 |

MASK STRUCTURE AND FCVA APPARATUS

CROSS-REFERENCE TO RELATED APPLICATIONS

This application is a national phase entry under 35 U.S.C. § 371 of International Application No. PCT/CN2020/099265, filed on Jun. 30, 2020, which claims priority to Chinese Application No. 201910605875.7 filed Jul. 5, 2019, the entire contents of both of which are incorporated herein by reference.

TECHNICAL FIELD

The present disclosure generally relates to the semiconductor manufacturing field and, more particularly, to a mask structure and a filtered cathodic vacuum arc (FCVA) apparatus.

BACKGROUND

In the semiconductor manufacturing process, a processed workpiece (e.g., a wafer) needs to be fixed by an electrostatic chuck (ESC) in an electrostatic absorption manner to prevent the processed workpiece from moving during the processing.

Generally, an electrostatic chuck usually includes a dielectric layer for supporting the processed workpiece. One or more electrodes are embedded in the dielectric layer. Taking a bipolar electrostatic chuck as an example, the bipolar electrostatic chuck includes two electrodes, which are electrically connected to positive and negative poles of a DC power supply, respectively, to provide a DC voltage. Thus, the wafer is firmly adsorbed on the surface of the chuck using electrostatic attraction.

However, this close contact between the workpiece and the electrostatic chuck may cause friction between the workpiece and the chuck, which may cause the generation of fine particles. As the processing time increases, a quantity of particles will gradually increase. A large quantity of particles may adhere to the back surface of the processed workpiece. Then, the large quantity of particles may be transferred to different chambers as the process steps progress. Thus, the semiconductor process is adversely affected.

To avoid the above situation, one approach is to make several protrusions that are arranged at intervals from each other on the surface of the electrostatic chuck. As such, the back surface of the workpiece can only be in contact with the protrusions but not with other portions of the electrostatic chuck, which can reduce the quantity of particles adhering to the back surface of the workpiece. One method of preparing the above-mentioned protrusions is to use a physical vapor deposition (hereinafter referred to as PVD) apparatus to prepare the protrusions. However, the protrusions made by the PVD apparatus have poor high-temperature resistance and can fall off easily. Thus, the protrusions cannot be applied in a high-temperature environment.

SUMMARY

The present disclosure aims to solve at least one of the technical problems existing in the prior art and provides a mask structure. The mask structure can be conductive and prevent a side surface of an electrostatic chuck from being coated. Thus, the mask structure can be applied in a filtered cathodic vacuum arc (FCVA) process. In addition, embodiments of the present disclosure further provide an FCVA apparatus, which includes the above-mentioned mask structure provided by embodiments of the present disclosure. The FCVA apparatus can utilize the FCVA process to produce protrusions on the carrying surface of the electrostatic chuck.

To achieve the above objective, embodiments of the present disclosure provide a mask structure, which is configured to manufacture protrusions on a carrying surface of an electrostatic chuck. The mask structure includes a main mask plate and a side mask plate that are made of conductive metal. The main mask plate is used to form a patterned film layer corresponding to the protrusions on the carrying surface of the electrostatic chuck. The side mask plate is used to completely shield the side surface of the electrostatic chuck to avoid forming a film layer on the side surface.

As another technical solution, embodiments of the present disclosure also provide an FCVA apparatus, including a power source, a chamber, and a graphite target, an electrostatic chuck, and a mask structure arranged in the chamber. The power source is configured to cause the graphite target to generate carbon plasma by an effect of an arc. The mask structure includes the above-mentioned mask structure provided by embodiments of the present disclosure and is configured to guide the deposited ions in the carbon plasma to move toward the carrying surface of the electrostatic chuck. The deposited ions that pass through form a patterned film layer corresponding to the protrusions on the carrying surface of the electrostatic chuck.

The beneficial effects of embodiments of the present disclosure include as follows.

In the mask structure and the technical solution of the FCVA device provided by embodiments of the present disclosure, the mask structure includes a main mask plate and a side mask plate, both made of conductive metal. Thus, when the protrusions are manufactured, the mask structure as a whole may be maintained at a ground level by being grounded, such that the deposited ions in the carbon plasma can be guided to move toward the electrostatic chuck. Meanwhile, the deposited ions that pass through the main mask plate may form the patterned film layer corresponding to the protrusions on the carrying surface of the electrostatic chuck. In addition, the side surface of the electrostatic chuck may be shielded by the side mask plate, which may prevent the deposited ions from forming a film layer on the side surface. As such, the electrostatic chuck can be protected. The mask structure of embodiments of the present disclosure may be applied in the FCVA apparatus due to the conductive and anti-side surface coating characteristics. The mask structure may be configured to produce the protrusions on the carrying surface of the electrostatic chuck by using FCVA.

DETAILED DESCRIPTION OF THE EMBODIMENTS

To enable those skilled in the art to better understand the technical solutions of the present disclosure, a mask structure and a filtered cathodic vacuum arc (FCVA) apparatus provided by embodiments of the present disclosure are described in detail below in connection with the accompanying drawings.

In the related technology, a physical vapor deposition (PVD) apparatus is usually configured to prepare protrusions on a carrying surface of an electrostatic chuck. However, the protrusions produced by the PVD apparatus may have poor high-temperature resistance and fall off easily. Thus, the protrusions cannot be used in a high-temperature environment.

The inventor found that the protrusions may be prepared by using the FCVA apparatus. The protrusions prepared by the FCVA apparatus may have a higher hardness and good wear resistance and can be used in a high-temperature environment (above 250° C.). However, due to the difference in structure and coating principles between the PVD apparatus and the FCVA apparatus, the mask plate used in the existing PVD apparatus cannot be used in the FCVA apparatus. Therefore, if the FCVA apparatus is used to prepare the protrusions on the carrying surface of the electrostatic chuck, a mask plate that can be applied to the FCVA apparatus may be needed.

To solve the above-mentioned problems, embodiments of the present disclosure provide a mask structure. The mask structure may be applied in the FCVA apparatus for producing the protrusions on the carrying surface of the electrostatic chuck.

Figure 1:
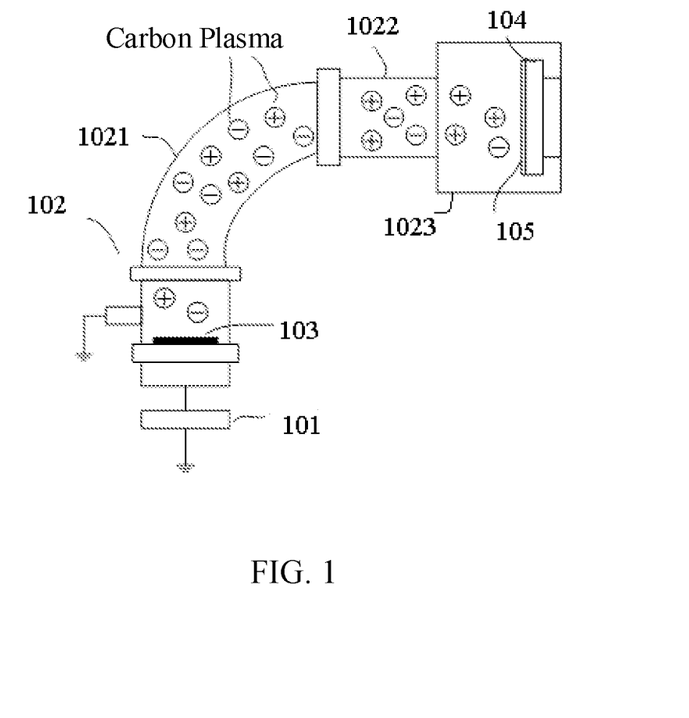
FIG. 1 is a schematic structural diagram of a filtered cathodic vacuum arc (FCVA) apparatus according to some embodiments of the present disclosure.

FIG. 1 is a schematic structural diagram of an FCVA apparatus according to some embodiments of the present disclosure. With reference to FIG. 1, the FCVA apparatus prepares protrusions by using FCVA technology. Specifically, the FCVA apparatus includes a power source 101, a chamber 102, and a graphite target 103, an electrostatic chuck 104, and a mask structure 105 placed in the chamber 102. The power source 101 may be configured to make the graphite target 103 generate carbon plasma through the action of an arc. The power source 101 may include, for example, an arc power source. The mask structure 105 may be configured to guide the deposited ions in the carbon plasma to form a film layer corresponding to the protrusions on the carrying surface of the electrostatic chuck 104. The film layer corresponding to the protrusions means that the film layer includes a designated pattern. The designated pattern may be same as the mask pattern, that is, form the pattern of the protrusions.

The above FCVA apparatus may accurately control the energy of the carbon plasma according to different process requirements. Meanwhile, the resistivity of the protrusions may be well controlled by using the above-mentioned FCVA apparatus. Thus, the resistivity of the protrusions may be controlled in a range of 104-109 Ω·cm. As such, the conductivity of the protrusions may meet the requirements.

In some embodiments, when the carbon plasma moves toward the carrying surface, the carbon plasma is filtered and/or focused by a magnetic field.

Specifically, the chamber 102 includes a first part 1021, a second part 1022, and a third part 1023 arranged in sequence along a direction of movement of the carbon plasma. The three may be communicated to each other in the chamber 102. A filtering magnetic field may be arranged in the second part 1022 and configured to filter macroparticles and atomic groups in the carbon plasma. After such a magnetic filtration process, an ionization rate of ions used for deposition (referred to as deposition ions) may be as high as 100%. Moreover, large particles may be filtered out. As such, without heating the electrostatic chuck 104, after the interaction with the magnetic field, the FCVA deposited ions may have higher and more uniform energy. Thus, the FCVA deposited ions may form a dense, high hardness, low resistivity, and super strong adhesive film layer in a low-temperature condition.

In addition, a focusing magnetic field may be arranged in the third part 1023 of the chamber 102 to converge the deposited ions to the electrostatic chuck. Thus, a hydrogen-free amorphous carbon layer may be deposited on the carrying surface of the electrostatic chuck to finally form the protrusions.

It should be noted that the above-mentioned deposited ions include ions in the carbon plasma that have not been removed by magnetic filtration. The ions may move toward the carrying surface of the electrostatic chuck under the guidance of the mask structure 105 and be deposited on the carrying surface to form the film layer. The above-mentioned deposited ions may include, for example, metal ions (such as Ti ions) or ions generated by another material that can be used to prepare the protrusions.

The above FCVA apparatus may accurately control the energy of the carbon plasma according to different process requirements. Meanwhile, the resistivity of the protrusions may be well controlled by using the above-mentioned FCVA apparatus and process. Thus, the resistivity of the protrusions may be controlled in the range of 104-109 Ω·cm. Therefore, the conductivity of the protrusions may meet the requirements.

The above-mentioned mask structure 105 may include a mask plate prepared in advance before the electrostatic chuck 104 is prepared. The electrostatic chuck 104 needs to be arranged sidewise in the chamber 102 in the FCVA apparatus, for example, the electrostatic chuck 104 shown in FIG. 1. The carrying surface of the electrostatic chuck 104 is arranged vertically. In such a situation, while performing pattern coating on the carrying surface, a mask structure that can protect the side surface of the electrostatic chuck 104 from being side-coated may be required. Here, the side surface of the electrostatic chuck may refer to the surface of the electrostatic chuck that is exposed to the plasma environment except for the carrying surface. Meanwhile, during the FCVA process, the deposited ions may rush to the ground level. Thus, a conductive metal may need to be used to make the mask plate, which may be grounded to maintain at the ground level as a whole. Thus, the deposited ions may be guided to move toward the carrying surface of the electrostatic chuck to be finally deposited on the carrying surface.

Figure 2:
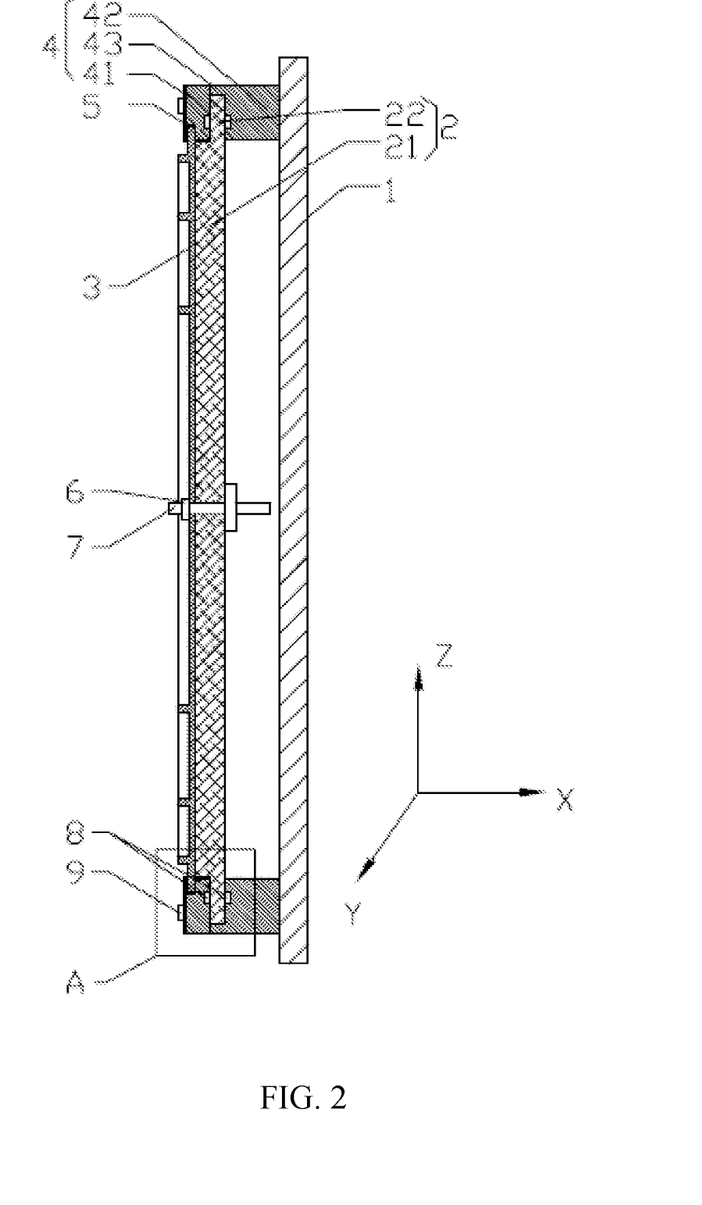
FIG. 2 is a schematic cross-section diagram of a mask structure after assembly according to some embodiments of the present disclosure.

Therefore, embodiments of the present disclosure provide a mask structure, which may be applied in the FCVA apparatus for preparing the protrusions on the carrying surface of the electrostatic chuck by using the FCVA process. Specifically, referring to FIG. 2, the electrostatic chuck 2 is laterally hanged and fixed in the chamber 102 of the FCVA apparatus shown in FIG. 1 through a mounting plate 1. Thus, the carrying surface may be perpendicular to a horizontal plane. As shown in FIG. 2, an X-direction is a horizontal direction, a plane of a Z-direction and a Y direction are perpendicular to the X-direction. The carrying surface of the electrostatic chuck 2 is parallel to the plane of the Z direction and the Y direction, that is, perpendicular to the X-direction.

To facilitate the description, "front surfaces" of all components mentioned in the specification are surfaces that face to a same direction as the carrying surface of the electrostatic chuck 2. "Back surfaces" of all components mentioned in the specification are surfaces that face to an opposite direction as the carrying surface. As shown in FIG. 2, the direction of the "front surface" is opposite to the direction indicated by the arrow of the X direction. The direction of the "back surface" is the same as the direction indicated by the arrow of the X direction.

The mask structure includes a main mask plate 3 and a side mask plate 4, both made of a conductive metal. The main mask plate 3 may be configured to form a patterned film layer on the carrying surface of the electrostatic chuck 2 corresponding to the protrusions. Specifically, the main mask plate 3 may include a hollow part consistent with a shape and size of a protrusion. The hollow part does not block the carrying surface of the electrostatic chuck 2. Thus, during the deposition, the deposited ions may be deposited on an area of the carrying surface of the electrostatic chuck 2 corresponding to the hollow part. The deposited ions may not be deposited on the other area on the carrying surface of the electrostatic chuck 2 not corresponding to the hollowed-out part. Thus, the patterned film layer may be formed on the carrying surface. That is, the protrusion may be formed.

The side mask plate 4 may be configured to cover the side surface of the electrostatic chuck 2 to avoid forming a coating on the side surface, that is, to prevent the side surface of the electrostatic chuck 2 from being side-coated. Thus, the electrostatic chuck may be protected.

Since the above-mentioned main mask plate 3 and side mask plate 4 are made of the conductive metal, when preparing the protrusions, both of the main mask plate 3 and the side mask plate 4 may be grounded to maintain as a whole at the ground level. Thus, the deposited ions in the carbon plasma may be guided to move toward the electrostatic chuck. Meanwhile, the deposited ions passing through the main mask 3 may form the patterned film layer on the carrying surface of the electrostatic chuck corresponding to the protrusions.

Therefore, the mask structure provided by embodiments of the present disclosure, due to its electrically conductive and anti-side coating characteristics, may be applied to the FCVA apparatus for preparing the protrusions on the carrying surface of the electrostatic chuck 2 by using the FCVA process.

Figure 3:
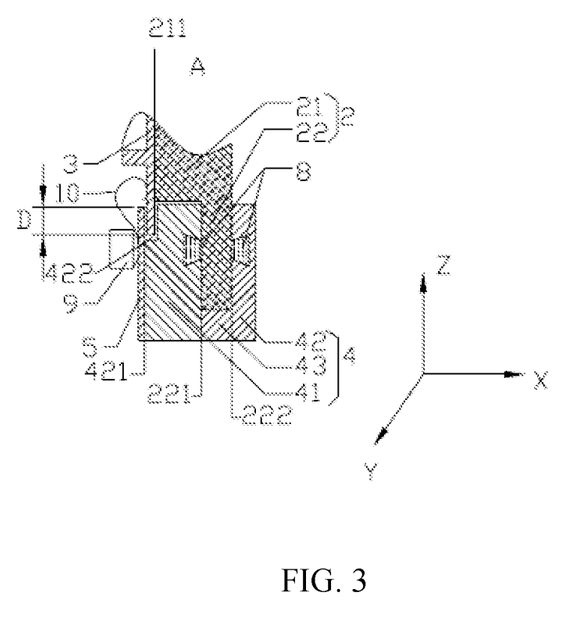
FIG. 3 is a schematic enlarged view showing area A in FIG. 2.
Figure 4A:
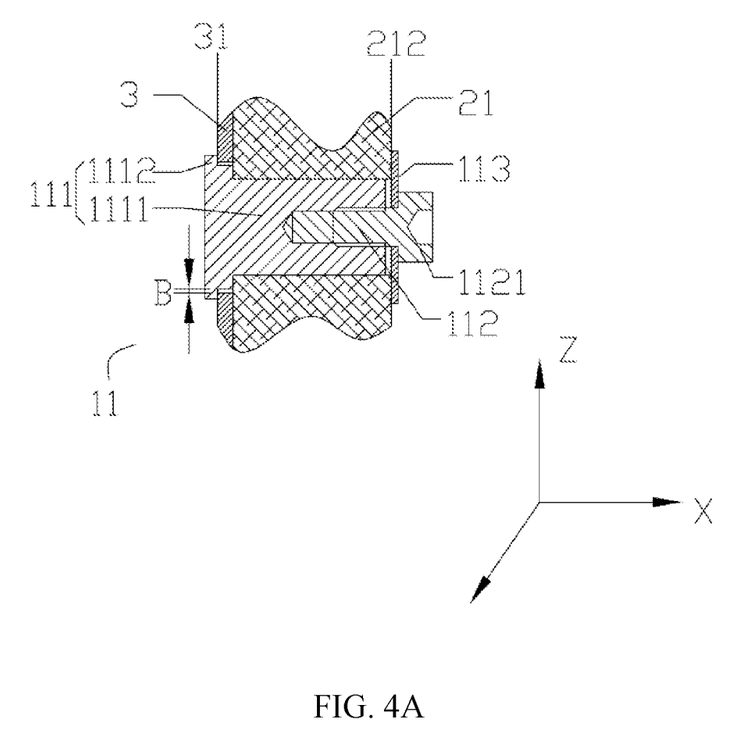
FIG. 4A is a schematic cross-section diagram of a floating lock assembly according to some embodiments of the present disclosure.

As shown in FIGS. 3 and 4A, the electrostatic chuck 2 generally includes a main body portion 21 and an edge portion 22 protruding from the side surface of the main body portion 21. The back surface 222 of the edge portion 22 is flush with the back surface 212 of the main body portion 21. The thickness of the edge portion 22 is smaller than the thickness of the main body portion 21. In this case, the side mask plate 4 is arranged around the side surface of the main body portion 21 of the electrostatic chuck 2 and covers the edge portion 22. As such, the side surface of the main body portion 21, the front surface, back surface, and side surface of the edge portion 22 are covered by the side mask plate 4. Thus, the entire side surface of the electrostatic chuck 2 may be effectively shielded. Even the back surface of the edge portion 22 may also be shielded to effectively protect the electrostatic chuck 2.

As shown in FIG. 3, to facilitate installation, the side mask plate 4 includes a first body 41, a second body 42, a third body 43, and a fastener 9. The first body 41 is arranged on a side of the front surface 221 of the edge portion 22 of the electrostatic chuck 2. The second body 42 is arranged on a side of the back surface 222 of the edge portion 22. The third body 43 is arranged around the side surface of the edge portion 22 of the electrostatic chuck 2. The third body 43 is configured to shield the side surface of the edge portion 22. Moreover, the third body 43 may be electrically contacted the first body 41 and the second body 42 to maintain the same potential.

In some embodiments, the third body 43 and the first body 41 may be formed integrally. The third body 43 may electrically contact the second body 42. However, embodiments of the present disclosure are not limited to this. In practical applications, the third body may also be formed integrally with the second body 42 and electrically contact the first body 41. Alternatively, two third bodies 43 may be included and be formed integrally with the first body 41 and the second body 42, respectively. The two third split bodies 43 may be electrically contact with each other. As such, the first body 41 and the second body 42 may maintain at the same potential. Of course, the third body 43 may also be connected to the first body 41 or the second body 42 in another electrically conductive manner other than the integral formation, such as welding.

The fastener 9 may be configured to fixedly connect the first body 41 and the second body 42 to the edge portion 22 of the electrostatic chuck. As such, the first body 41 and the second body 42 may clamp and fix the edge portion 22 between the first body 41 and the second body 42. The fastener 9 may include, for example, a connection screw. The connection screw may sequentially penetrate the first split body 41, the second split body 42, and the edge portion 22 of the electrostatic chuck and be threaded to the installation plate 1. Thus, the first body 41, the second body 42, and the edge portion 22 of the electrostatic chuck may be fixed on the installation plate 1.

In some embodiments, a buffer 8 may be arranged between the first body 41 and the edge portion 22 of the electrostatic chuck and/or between the second body 42 and the edge portion 22 of the electrostatic chuck. The buffer 8 may be configured to prevent a ceramic layer of the electrostatic chuck from being crushed. Optionally, the buffer 8 may include an elastic member capable of buffering, such as a seal ring or a buffer gasket.

In some embodiments, a radial gap may exist between the side surface of the main mask plate 3 and an inner side surface of the second body 42 of the side mask plate 4. During the process, the main mask plate 3 may often deform due to thermal expansion. In this case, by reserving an appropriate gap between the side surface of the main mask plate 3 and an inner side surface of the second body 42 of the side mask plate 4, the main mask plate 3 may be allowed to deform to a certain degree to avoid the main mask plate 3 from being damaged. Similarly, radial gaps with appropriate sizes may be reserved between the inner side surface of the second body 42 of the side mask plate 4 and the side surface of the main body portion 21 of the electrostatic chuck 2, and between the inner side surface of the third body 43 and the edge portion 22 of the electrostatic chuck 2 to allow the ceramic layer of the electrostatic chuck 2 to deform to a certain degree. Thus, the ceramic layer may be avoided from being damaged.

In some embodiments, as shown in FIGS. 2 and 3, the mask structure further includes a ring-shaped shield plate 5. The ring-shaped shield plate 5 is arranged on the side mask plate 4. The ring-shaped shield plate 5 is specifically stacked on the front surface 421 of the first body 41. The ring-shaped shield plate 5 is located on the side of the front surface of the main mask plate 3. The inner edge of the ring-shaped shield plate 5 extends to the inner side of the edge of the main mask plate 3. As shown in FIG. 3, the inner edge of the ring-shaped shield plate 5 is located on the inner side of the edge of the main mask plate 3. A radial distance between the ring-shaped shield plate 5 and the main mask plate 3 is D. By extending the inner edge of the ring-shaped shield plate 5 to the inner side of the edge of the main mask plate 3, the above-mentioned radial gap formed between the side surface of the main mask plate 3 and the inner surface of the first body 41 of the side mask plate 4 may be shielded to prevent the plasma from entering the gap.

In some embodiments, as shown in FIG. 3, a ring-shaped recess 422 is further arranged on the inner surface of the first body 41 of the side mask plate 4. The ring-shaped recess 422 penetrates to the front surface 421 of the first body 41. The edge portion of the main mask plate 3 is located in the ring-shaped recess 422. As such, the radial gap between the inner side surface of the first body 41 and the side surface of the main mask plate 3 may form a maze channel to further preventing the plasma from entering.

Preferably, the mask structure may further include a conductive structure. The conductive structure may be configured to electrically conduct the main mask plate 3 and the side mask plate 4. As such, the main mask plate 3 and the side mask plate 4 can maintain as the whole at the same potential. Thus, during the FCVA process, the deposition ions may be guided to move toward the ground level by grounding the main mask plate 3 and the side mask plate 4 to deposit the deposited ions on the carrying surface of the electrostatic chuck 2.

In some embodiments, the above-mentioned conductive structure may include a conductive elastic member. The conductive elastic member may be electrically connected to the main mask plate 3 and the side mask plate 4. For example, as shown in FIG. 3, the conductive elastic member includes a conductive spring 10. One end of the conductive spring 10 is electrically connected to the main mask plate 3, and the other end is fixed at the fastener 9 and electrically connected to the ring-shaped shield plate 5. The ring-shaped shield plate 5 may be electrically connected to the side mask plate 4. Thus, the main mask plate 3, the ring-shaped shield plate 5, and the side mask plate 4 may be maintained at the same potential. The above-mentioned conductive spring 10 may include, for example, a beryllium copper spring.

The main mask plate 3, the ring-shaped shield plate 5, and the side mask plate 4 may be maintained at the same potential by the above-mentioned conductive elastic member. Since the conductive elastic member is elastic and deforms during the thermal expansion of the main mask plate 3, the conductive elastic member may still maintain electrical contact with the main mask plate 3 by using the elasticity of the conductive elastic member. Thus, the stability of the connection may be improved.

Figure 4B:
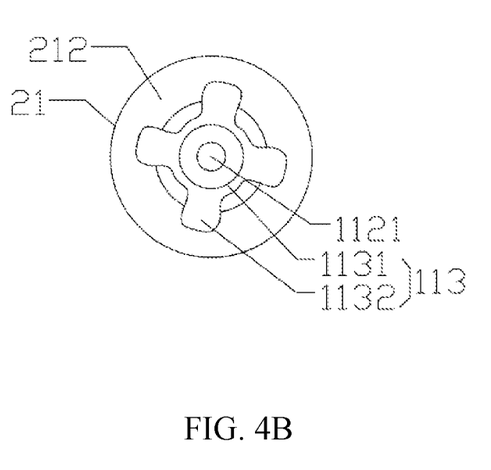
FIG. 4B is a schematic side view showing the floating lock assembly located on a back surface of an electrostatic chuck according to some embodiments of the present disclosure.

In some embodiments, as shown in FIGS. 4A and 4B, the mask structure further includes a float lock assembly 11. The float lock assembly 11 may be configured to fix the main mask plate 3 on the carrying surface by applying a unidirectional elastic force toward the carrying surface (i.e., the front surface of the main body portion 21) of the electrostatic chuck 2 to the main mask plate 3. The "unidirectional elastic force" may refer to a force applied only in a single direction. Thus, the force receiving party may be only constrained in single direction. The force receiving party may not be constrained by the force in the other directions.

Since the main mask plate 3 receives only a pressing force perpendicular to the front surface of the main mask plate 3, the main mask 3 may only be constrained in the X-direction. Thus, the main mask plate 3 may be allowed to generate thermal expansion and deformation in the other directions. The main mask plate 3 may not be damaged by being constrained in a plurality of directions. Meanwhile. Since the pressing force applied by the float lock assembly 11 is an elastic force, that is, the float lock assembly 11 has a certain elasticity, the main mask plate 3 may be allowed to generate a certain degree of thermal expansion and deformation in the X-direction. Thus, the stability of the connection may be improved.

In some embodiments, the above-mentioned float lock assembly 11 may include a first connection member 111, a second connection member 112, and an elastic member 113. A first through-hole may be arranged along a thickness direction of the main mask plate 3 penetrating the main mask plate 3. Correspondingly, a second through-hole may be arranged in the main body portion 21 of the electrostatic chuck 2 along a thickness direction of the main body portion 2 penetrating oppositely. The first connection member 111 may include, for example, a lock nut 1111. The lock nut 1111 may be arranged in the above first through-hole and the second through-hole. A first flange 1112 is arranged at a first end of the lock nut 1111 (a left end of the lock nut 1111 in FIG. 4A). The first flange 1112 is stacked on the front surface 31 of the main mask plate 3. The position of the lock nut 1111 may be constrained in the first through-hole and the second through-hole.

The second connection member 112 is, for example, a screw, which passes through the second through-hole. One end of the screw is threadedly connected to the second end of the lock nut 1111 (a right end of the lock nut 1111 in FIG. 4A). The other end of the screw is provided with a second flange 1121 (i.e., the head of the screw). The second flange 1121 is located on the side of the back surface 212 of the main body portion 21 of the electrostatic chuck 2 and is arranged at an interval from the main body portion 21.

The elastic member 113 may be arranged in the interval between the second flange 1121 and the main body portion 21 of the electrostatic chuck 2 and configured to apply the elastic force to the second flange 1121 to keep the second flange 1121 away from the main body portion 21 of the electrostatic chuck 2. As such, after the screw is tightened, a pre-tightening force may be generated between the second flange 1121 and the elastic member 113. Thus, the screw and the lock nut 1111 may together apply the unidirectional pressing force to the main mask plate 3 and the main body portion 21 of the electrostatic chuck 2 in the X-direction. Meanwhile, since the elastic member 113 has elasticity, when the main mask plate 3 thermally expands and deforms in the X direction, the elastic member 113 may deform elastically to protect the main mask plate 3 from being damaged.

In some embodiments, the above-mentioned elastic member 113 is an elastic sheet. As shown in FIG. 4B, the elastic sheet includes a ring-shaped sheet 1131 and a plurality of pressing claws 1132 arranged at intervals along a circumferential direction of the ring-shaped sheet 1131. The ring-shaped sheet 1131 is sleeved on the second connection member 112 and stacked with the second flange 1121. As such, when the screw is tightened, a pre-tightening force may be generated between the second flange 1121 the ring-shaped sheet 1131. A plurality of pressing claws 1132 are stacked on the back surface 212 of the main body portion 21 of the electrostatic chuck 2. The pressing claws 1132 may be elastically deformed as the main mask plate 3 thermally expands and deforms in the X-direction.

Certainly, in practical applications, the above-mentioned elastic member 113 may also include any other structures with elasticity, for example, a compression spring.

In some embodiments, optionally, a tightening torque of the second connection member 112 may range from 0.1 N·m to 0.4 N·m. By controlling the tightening torque of the second connection member 112 within the range, the main mask plate 3 may only be subjected to a slight unidirectional pressing force. Thus, the main mask plate 3 may easily overcome the unidirectional pressing force to thermally expand and deform in the X-direction.

As shown in FIG. 4A, a radial gap B exists between the lock nut 1111 and the first through-hole in the main mask plate 3. The radial gap B may be configured to prevent the lock nut 1111 from hindering the thermal expansion and deformation of the main mask plate 3 in the radial direction. Optionally, a value range of the radial gap may be from 0.1 mm to 0.3 mm. In this range, the lock nut 1111 may be prevented from hindering the thermal expansion and deformation of the main mask plate 3 in the radial direction.

It should be noted that in the above embodiments, the first connection member 111 and the second connection member 112 may be threadedly connected. That is, the lock nut 1111 cooperates with the screw. However, embodiments of the present disclosure are not limited to this. In practical applications, the first connection member 111 and the second connection member 112 may also be connected by any other detachable connection manners, such as a snap connection. In addition, the structures of the first connection member 111 and the second connection member 112 can be adaptively designed according to different detachable connection manners.

In practical applications, one float lock assembly 11 may be included. Preferably, a plurality of float lock assemblies 11 may be included and distributed at different positions of the main mask plate 3. Thus, the unidirectional pressing forces may be uniformly applied to the different positions of the main mask plate 3.

In some embodiments, optionally, as shown in FIG. 2, center through-holes are arranged in the main mask plate 3 and the main body portion 21 of the electrostatic chuck 2, respectively. The mask structure further includes a central fastener. The central fastener is arranged in and penetrates through the above-mentioned center through holes of the main mask plate 3 and the main body portion 21 of the electrostatic chuck 2. The central fastener is configured to fasten the main mask plate 3 to the main body portion 21 of the electrostatic chuck 2.

The above-mentioned central fastener may include, for example, a bolt. Specifically, a stud 7 of the bolt may pass through the center through-hole from the back surface 212 of the main body portion 21 of the electrostatic chuck 2. The nut 6 of the bolt may cooperate with the stud 7 and generate a pre-tightening force between the front surface of the main mask plate 3.

With the above-mentioned central fastener, based on the float fixation of the above-mentioned float lock assembly 11, rigid fixation may be applied to the central position of the main mask plate 3. Since the fixing point is located at the central position of the main mask plate 3. Hindrance of the central fastener to the thermal expansion and deformation of the main mask plate 3 and the electrostatic chuck 2 may be neglected. Thus, the connection stability between the main mask plate 3 and the electrostatic chuck 2 may be further improved.

In addition, based on arrangement of the central fastener, a conductive elastic member such as a wire may be used to realize the electrical conduction between the main mask plate 3 and the side mask plate 4. Specifically, one end of the wire may be fixedly connected to the side mask plate 4 and electrically connected. The other end of the wire may be fixedly connected to the central fastener (such as the stud or the nut of the bolt) and electrically connected.

Figure 5:
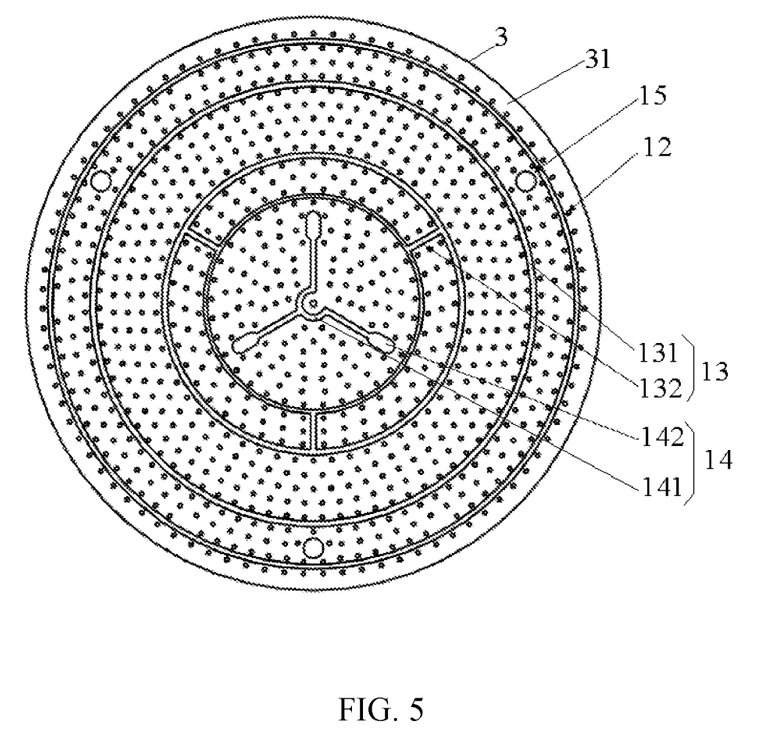
FIG. 5 is a schematic side view showing a front surface of a main mask plate according to some embodiments of the present disclosure.

In some embodiments, as shown in FIG. 5, a plurality of process holes 12 in one-to-one correspondence with the protrusions are arranged in the main mask plate 3. Optionally, the diameter E of the process hole 12 may range from 1 mm to 5 mm. A center distance between two adjacent process holes 12 may range from 5 mm to 15 mm.

Of course, in practical applications, parameters such as a size, a shape, and arrangement of the process holes 12 may be freely set according to the design of the protrusions. In some embodiments, the structure and parameters of the process hole 12 may be designed by taking the plurality of protrusions distributed at intervals and formed on the carrying surface of the electrostatic chuck 2 as an example.

In some embodiments, a rib structure 13 may be arranged on the front surface 31 of the main mask plate 3, and located in an area other than the area where the process holes 12 are located (i.e., the non-hollowed area). The rib structure 13 may be configured to further increase the strength and flatness of the main mask plate 3. The flatness may be improved to make the back surface of the main mask plate 3 and the front surface 211 of the main body portion 21 of the electrostatic chuck 2 more closely fit. Thus, the quality of the mask process may be improved. Optionally, the above flatness may be controlled within 0.05.

Specifically, as shown in FIG. 5, the above-mentioned rib structure 13 includes a ring-shaped rib 131 by using the center of the main mask plate 3 as a circle center or a plurality of ring-shaped ribs 131 with different radii. When the plurality of ring-shaped ribs 131 are included, a plurality of radial connection ribs 132 may be arranged and distributed along the circumferential direction between two adjacent ring-shaped ribs 131. As such, the strength of the entire main mask plate 3 can be comprehensively improved, which is more beneficial to improve the flatness.

Figure 6:
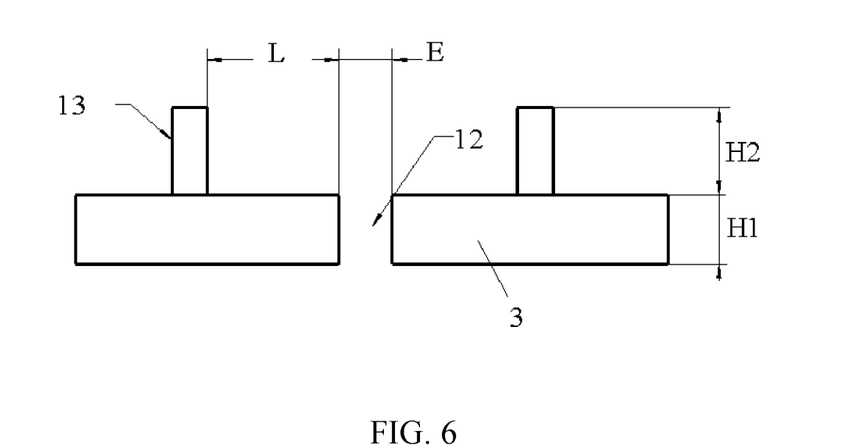
FIG. 6 is a schematic diagram showing a partial dimension of the main mask plate according to some embodiments of the present disclosure.

As shown in FIG. 6, optionally, a thickness H2 of the above-mentioned rib structure 13 is greater than or equal to 1 mm. Thus, the strength and flatness of the main mask plate 3 may be effectively improved. A sum (H2+H1) of the thickness of the rib structure 13 and the main mask plate 3 is less than or equal to 5 mm. The thickness of the main mask plate 3 is less than or equal to 1.5 mm. A distance L between the rib structure 13 and an edge of any adjacent process hole 12 is greater than or equal to 2 mm. Here, the thickness of the main mask plate 3 should not be too thick to avoid hindering the plasma from passing through. For a same purpose, the thickness of the rib structure 13 should not be too thick, and the above-mentioned distance L should not be too small.

In some embodiments, as shown in FIG. 5, a process hollow part 14 is further arranged in a central area of the main mask plate 3 for forming a conductive film for testing on the carrying surface of the electrostatic chuck 2. The shape of the process hollow part 14 should be adapted to the shape of the electrostatic chuck 2 to achieve a test function. For example, the process hollow part 14 includes an arc-shaped hollow part 141 and at least three strip-shaped hollow parts 142. The shape of the arc-shaped hollow part 141 may be a non-closed ring. The center of the ring may coincide with the center of the main mask plate 3. The at least three strip-shaped hollow parts 142 are symmetrically distributed about the center of the arc-shaped hollow part 141. One end of each strip-shaped hollow part 142 is connected to the arc-shaped hollow part 141, and the other end extends along the radial direction of the arc-shaped hollow part 141.

Optionally, a thermal expansion coefficient of the conductive metal used by the main mask plate 3 and the side mask plate 4 may range from 3×10-6/° C. to 10×10-6/° C. The thermal expansion coefficient of the conductive metal in this range is low, which is easy to match the thermal expansion coefficient of the material used by the electrostatic chuck 2 (usually alumina ceramic). That is, a metal with the thermal expansion coefficient that is the same as the thermal expansion coefficient of the electrostatic chuck 2. Thus, the problem of inaccurate pattern coating caused by the thermal expansion of the mask plate during the coating process may be significantly improved.

Optionally, the above-mentioned conductive metal may include a conductive metal with the thermal expansion coefficient satisfying the above requirements, such as an iron-cobalt-nickel alloy or titanium, etc. The available Chinese grades of iron-cobalt-nickel alloys may include 4J5, 4j6, 4j9, 4j18, 4j20, 4j28, 4j29, 4j30, 4j31, 4j32, 4j33, 4j34, 4j35, 4j36, 4j38, 4j40, 4j42, 4j44, 4j45, 4j46, 4j47, 4j48, 4j49, 4j50, 4j52, 4j54, 4j58, 4j78, 4j80, etc.

In summary, in the technical solution of the mask structure and the FCVA apparatus provided by embodiments of the present disclosure, the mask structure may include a main mask plate and a side mask plate that are both made of a conductive metal. Thus, when preparing the protrusions, the main mask plate and the side mask plate as shown may be grounded to be maintained at the ground level. Thus, the deposited ions in the carbon plasma may be guided to move toward the electrostatic chuck. Meanwhile, the deposited ions passing through the main mask plate may form a patterned film layer on the carrying surface of the electrostatic chuck corresponding to the protrusions. In addition, by shielding the side surface of the electrostatic chuck with the side mask plate, the deposited ions may be prevented from forming a film layer on the side surface to protect the electrostatic chuck. The mask structure provided by embodiments of the present disclosure may be applied to the FCVA apparatus due to the electrically conductive and anti-side coating characteristics. The mask structure may be configured to prepare the protrusions on the carrying surface of the electrostatic chuck using the FCVA process.

It can be understood that above embodiments are merely exemplary used to illustrate the principle of the present disclosure, but the present disclosure is not limited to this. For those of ordinary skill in the art, various modifications and improvements may be made without departing from the spirit and essence of the present disclosure. These modifications and improvements are also within the scope of the present disclosure.

What is claimed is:

1. A mask structure configured to prepare protrusions on a carrying surface of an electrostatic chuck, comprising:
   a main mask plate made of a conductive metal and configured to form a patterned film layer corresponding to the protrusions on the carrying surface of the electrostatic chuck;
   a side mask plate made of the conductive metal and configured to shield a side surface of the electrostatic chuck to avoid forming a film layer on the side surface;
   a float lock assembly configured to apply a unidirectional force toward the carrying surface of the electrostatic chuck on the main mask plate to fix the main mask plate to the carrying surface, correspondingly, a center through hole being arranged in the main mask plate and a main body portion of the electrostatic chuck; and
   a center fastening bolt configured to be mounted in the center through hole to fix the main mask plate to the main body portion of the electrostatic chuck.

2. The mask structure according to claim 1, wherein the side mask plate is configured to be arranged around the side surface of the main body portion of the electrostatic chuck and cover an edge portion of the electrostatic chuck protruding from the side surface of the main body portion.

3. The mask structure according to claim 2, wherein the side mask plate includes:
   a first body arranged on a front surface of the edge portion of the electrostatic chuck;
   a second body arranged on a back surface of the edge portion of the electrostatic chuck;
   a third body arranged around a side surface of the edge portion of the electrostatic chuck and electrically contacting with the first body and the second body; and
   a fastener screw configured to fixedly connect the first body and the second body to the edge portion of the electrostatic chuck.

4. The mask structure according to claim 3, wherein a buffer is arranged between the first body and the edge portion of the electrostatic chuck and/or between the second body and the edge portion of the electrostatic chuck.

5. The mask structure according to claim 1, further comprising:
   a ring-shaped shield plate arranged on a front surface of the main mask plate, and an inner edge of the ring-shaped shield plate extending to an inner side of an edge of the main mask plate.

6. The mask structure according to claim 1, wherein:
   a ring-shaped recess penetrating to a front surface of the side mask plate is arranged on an inner surface of the side mask plate; and
   an edge portion of the main mask plate is located in the ring-shaped recess.

7. The mask structure according to claim 1, further comprising:
   a conductive elastic member electrically connecting the main mask plate and the side mask plate.

8. The mask structure according to claim 1, wherein the float lock assembly includes:
   a lock nut including a nut body and a ring-shaped flange arranged at one end of the nut body, the ring-shaped flange protruding from a peripheral surface of the nut body, a threaded hole being arranged at an end surface of the other end of the nut body;
   a first through hole penetrating along a thickness direction of the main mask plate, correspondingly;
   a second through hole being arranged in a main body portion of the electrostatic chuck and penetrating along an opposite direction of the first through hole, the nut body penetrating the first through hole and the second through hole, and the ring-shaped flange being stacked on a front surface of the main mask plate;
a screw passing through penetrating the second through hole and cooperating with the threaded hole, a head of the screw being located on a back surface of the main body portion of the electrostatic chuck; and
an elastic member being arranged between the head of the screw and the back surface of the main body portion of the electrostatic chuck.

9. The mask structure according to claim 8, wherein the elastic member includes an elastic sheet or a compression spring.

10. The mask structure according to claim 9, wherein the elastic sheet includes:
a ring-shaped sheet sleeved on the screw and is stacked on the head of the screw; and
a plurality of pressing claws arranged on the back surface of the main body portion of the electrostatic chuck.

11. The mask structure according to claim 8, wherein a tightening torque of the screw ranges from 0.1 N·m to 0.4 N·m.

12. The mask structure according to claim 8, wherein a radial gap exists between the screw and the first through hole.

13. The mask structure according to claim 1, wherein one or a plurality of float lock assemblies are included, and the plurality of float lock assemblies are distributed at different positions of the main mask plate.

14. The mask structure according to claim 1, wherein:
a plurality of process holes are arranged in the main mask plate in a one-to-one correspondence with the protrusions; and
a rib structure is arranged in an area other than an area where the process holes are located on a front surface of the main mask plate and configured to increase strength and flatness of the main mask plate.

15. The mask structure according to claim 14, wherein:
the rib structure includes a ring-shaped rib using a center of the main mask plate as a center of a circle or a plurality of ring-shaped ribs with different radii; and
a plurality of radial ribs are arranged between two adjacent ring-shaped ribs and distributed along a circumferential direction of the ring-shaped ribs.

16. The mask structure according to claim 14, wherein:
a thickness of the rib structure is greater than or equal to 1 mm;
a sum of thicknesses of the rib structure and the main mask plate is smaller than or equal to 5 mm;
a thickness of the main mask plate is smaller than or equal to 1.5 mm; and
a distance between the rib structure and an edge of any one of the process holes is greater than or equal to 2 mm.

17. The mask structure according to claim 14, further comprising:
a hollow portion arranged at a center area of the main mask plate and configured to form a conductive film on the carrying surface of the electrostatic chuck.

18. The mask structure according to claim 17, wherein the hollow portion includes:
an arc-shaped hollow portion, a center of the arc-shaped hollow portion coinciding with the center of the main mask plate; and
at least three stripe hollow portions symmetrically arranged about the center of the arc-shaped hollow portion, an end of each of the strip hollow portions being connected to the arc-shaped hollow portion, and another end extending along a radial direction of the arc-shaped hollow portion.

19. The mask structure according to claim 1, wherein the thermal expansion coefficient of the conductive metal is same as a thermal expansion coefficient of the electrostatic chuck.

20. An FCVA apparatus comprising:
a chamber;
a graphite target arranged in the chamber;
an electrostatic chuck arranged in the chamber;
a mask structure arranged in the chamber and including:
a main mask plate made of a conductive metal and configured to form a patterned film layer corresponding to the protrusions on the carrying surface of the electrostatic chuck;
a side mask plate made of the conductive metal and configured to shield a side surface of the electrostatic chuck to avoid forming a film layer on the side surface;
a float lock assembly configured to apply a unidirectional force toward the carrying surface of the electrostatic chuck on the main mask plate to fix the main mask plate to the carrying surface, correspondingly, a center through hole being arranged in the main mask plate and a main body portion of the electrostatic chuck; and
a center fastening bolt configured to be mounted in the center through hole to fix the main mask plate to the main body portion of the electrostatic chuck; and
a power source configured to cause the graphite target to generate carbon plasma through an effect of an arc and deposit a film layer to form protrusions on a carrying surface of the electrostatic chuck through the mask structure.

* * * * *